(12) United States Patent
Pires

(10) Patent No.: US 11,072,298 B1
(45) Date of Patent: Jul. 27, 2021

(54) ON-DEMAND POWER SUPPLY IN VEHICLE SOUND SYSTEM

(71) Applicant: Stillwater Designs and Audio, Inc., Stillwater, OK (US)

(72) Inventor: Fernando Eid Pires, Stillwater, OK (US)

(73) Assignee: Stillwater Designs and Audio, Inc., Stillwater, OK (US)

( * ) Notice: Subject to any disclaimer, the term of this patent is extended or adjusted under 35 U.S.C. 154(b) by 121 days.

(21) Appl. No.: 16/231,824

(22) Filed: Dec. 24, 2018

Related U.S. Application Data

(60) Provisional application No. 62/614,376, filed on Jan. 6, 2018.

(51) Int. Cl.
| | | |
|---|---|---|
| *H03F 3/04* | (2006.01) | |
| *B60R 16/03* | (2006.01) | |
| *H03F 1/02* | (2006.01) | |
| *H03F 3/217* | (2006.01) | |
| *H03F 3/187* | (2006.01) | |

(52) U.S. Cl.
CPC ............ *B60R 16/03* (2013.01); *H03F 1/0211* (2013.01); *H03F 3/187* (2013.01); *H03F 3/217* (2013.01); *H03F 1/0244* (2013.01)

(58) Field of Classification Search
CPC ....... B60R 16/03; H03F 1/0211; H03F 3/217; H03F 3/187; H03F 1/0227; H03F 1/0244; H03F 2200/504; H03G 3/3042; H03G 3/004
USPC .................................................. 330/127, 297
See application file for complete search history.

(56) References Cited

U.S. PATENT DOCUMENTS

| | | |
|---|---|---|
| D305,333 S | 1/1990 | Irby |
| D307,015 S | 4/1990 | Irby |
| D355,193 S | 2/1995 | Irby |
| D449,293 S | 10/2001 | Irby et al. |
| D456,386 S | 4/2002 | Irby et al. |
| D473,216 S | 4/2003 | Irby et al. |
| 6,611,604 B1 | 8/2003 | Irby et al. |
| 6,731,773 B1 | 5/2004 | Bergbower et al. |
| 6,968,069 B1 | 11/2005 | Zhao |
| 7,482,870 B2 * | 1/2009 | Maejima ................. H03F 3/217 330/207 P |
| 7,916,890 B2 | 3/2011 | Irby et al. |
| 3,023,688 A1 | 9/2011 | Irby et al. |

(Continued)

FOREIGN PATENT DOCUMENTS

| | | |
|---|---|---|
| AU | 773216 B2 | 9/2004 |
| AU | 2004205159 | 8/2006 |

(Continued)

*Primary Examiner* — Khanh V Nguyen
(74) *Attorney, Agent, or Firm* — Mary M. Lee

(57) ABSTRACT

A method and system for controlling the switching power supply in a car audio system. The system includes a circuit that detects when the signal voltage is approaching the power supply voltage rails, that is, circuit anticipates the conditions that cause "clipping" of the signal. In response to detecting the pre-clipping condition, the circuit boosts the power supply. Additionally, the inventive system includes a holding circuit for sustaining the boosted power supply for a predetermined period of time. Thus, the power is boosted as needed and remains on for a period of time thereby preventing frequent, repetitive activation of the power supply.

26 Claims, 2 Drawing Sheets

(56) References Cited

U.S. PATENT DOCUMENTS

| | | |
|---|---|---|
| D783,577 S | 4/2017 | Ambrose et al. |
| D798,837 S | 10/2017 | Surratt et al. |
| D807,326 S | 1/2018 | Justis |
| D820,815 S | 6/2018 | Justis |
| 2003/0194104 A1 | 10/2003 | Irby et al. |
| 2008/0075318 A1 | 3/2008 | Zhao |
| 2008/0118098 A1 | 5/2008 | Irby et al. |

FOREIGN PATENT DOCUMENTS

| | | |
|---|---|---|
| CA | 2387939 | 9/2006 |
| CN | 101257733 | 8/2012 |
| EP | 1222839 | 7/2012 |
| ID | 018046 | 9/2006 |
| KR | 554818 | 2/2006 |
| MX | 227315 | 4/2005 |
| MY | 125083 | 7/2006 |
| SG | 87643 | 5/2005 |
| TH | 048559 | 3/2016 |
| TW | 498700 | 12/2002 |
| WO | 0131975 A2 | 5/2001 |

\* cited by examiner

ON-DEMAND POWER SUPPLY IN VEHICLE SOUND SYSTEM

CROSS-REFERENCE TO RELATED APPLICATIONS

This application claims the benefit of U.S. provisional application No. 62/614,376 entitled "On-Demand Power Supply in Vehicle Sound System," filed Jan. 6, 2018, the contents of which are incorporated herein by reference.

FIELD OF THE INVENTION

The present invention relates to sound systems generally and, more particularly but without limitation, to sound systems in vehicles.

BRIEF DESCRIPTION OF THE DRAWINGS

The accompanying drawings, which are incorporated into and form a part of the specification, illustrate one or more embodiments of the present invention and, together with this description, serve to explain the principles of the invention. The drawings merely illustrate a preferred embodiment of the invention and are not to be construed as limiting the scope of the invention.

DETAILED DESCRIPTION OF THE PREFERRED EMBODIMENT(S)

The 12-volt battery in most vehicles is inadequate for powering the amplifiers in most modern car audio systems. To supplement the power supply, most car audio amplifiers have a built-in switching-mode power supply. This substantially increases the power available for driving the system. For example, an ideal amplifier (no losses whatsoever) in full bridge configuration (BTL) using a 4-Ohm speaker with only the 12-volt power supply can deliver a maximum of 18 watts of power, which is inadequate. However, bumping that voltage to 24 volts allows the same amplifier to produce 72 watts. The difference between 72 watts and 18 watts of power is 12 dB. Hence, a system that will produce 98 dBs at 18 watts, which is relatively loud, will produce 110 dBs output at 72 watts, which is extremely loud.

Thus, the switching power supply greatly increases the performance of the sound system. However, most music is dynamic, ranging from relatively quiet to very loud, and the increased power supply is not required for the lower range sounds. Thus, for most music, the amplifier's maximum output power is not utilized at all times. The switching power supply in most systems runs constantly in order to increase the 12-volts to 24-volts but the 24-volts of power is only required a small portion of the time. For example, depending on the music being played, the boosted power level may only be required for less than ten percent (10%) of the operating time. In addition to being unnecessary, there are other disadvantages of running the power supply continuously. By way of example, these include higher idle temperature (no load), switching losses, transformer core losses, increased electromagnetic interference (EMI) emissions.

The present invention provides a system in which the switching power supply is supplied on demand, that is, the power supply is activated and deactivated, as needed. In accordance with the present invention, a circuit is provided that detects when the output voltage swing of the amplifier is approaching the power supply voltage rails. In this way, the circuit can "predict" that extra voltage will be necessary soon and, only then, activate the power supply.

Figure 1A:
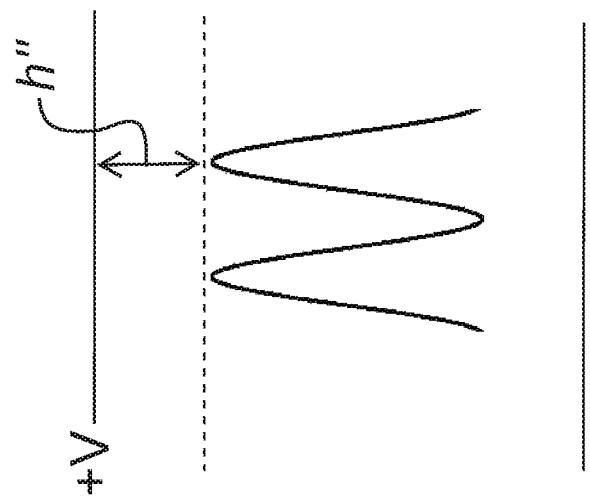
FIG. 1A shows the voltage swing well within the power rails +V and −V.
Figure 1B:
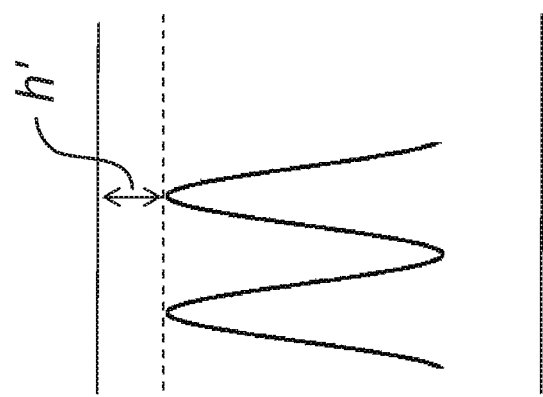
FIG. 1B shows the voltage swing approaching the "clipping" condition.
Figure 1C:
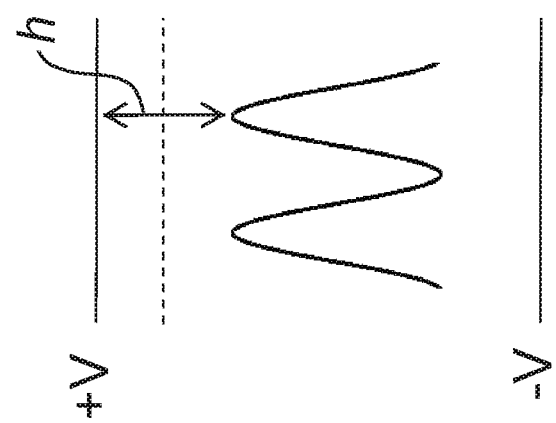
FIG. 1C shows the voltage swing after the inventive circuit has boosted the power supply.

FIG. 1A illustrates the voltage swing when the additional power is not needed. The "headroom" h shows the difference between the power required and the power available. FIG. 1B, shows the headroom h' of the voltage swing for louder sounds requiring additional power and more closely approaching the voltage rails, that is, operating in the pre-clipping condition. FIG. 1C illustrates the increased headroom h" between the voltage swing after the power supply is activated, removing the risk of clipping.

As illustrated in FIGS. 1A-C, whenever the headroom between the voltage swing of the speaker output and the power supply rails is less than a predetermined value, the amplifier is approaching the "clipping" condition, referred to herein as the "pre-clipping condition." When this condition is detected, the power supply is activated in order to increase this headroom. This drives the power supply voltage rails to a higher voltage. This process continuously happens until the maximum voltage of the power supply is achieved, at which point the system has reached its limit and no additional boosting is possible. In simple terms, whenever the amplifier is "about to clip," the power supply is triggered and prevents the clipping effect from happening, unless the power supply is "maxed out."

Figure 2:
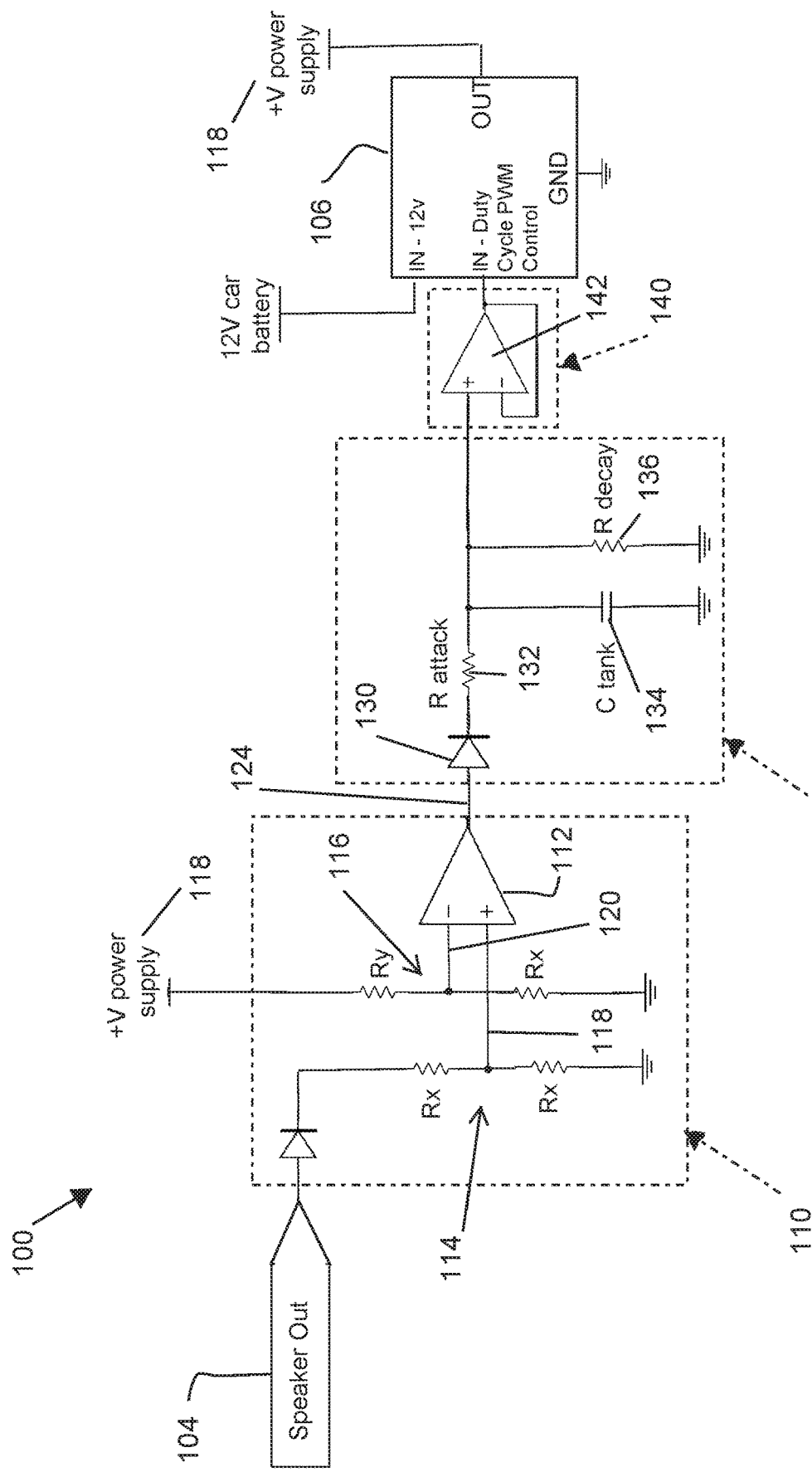
FIG. 2 is a circuit diagram in accordance with a preferred embodiment of the present invention.

As mentioned, music is a very dynamic signal. It may have parts that go almost or completely silent and other parts that it will be louder and more demanding. As explained above, this would result in the power supply being turned on and off constantly. This may introduce distortion as it will take some time to "boost" the voltage rails; it would struggle to keep up with the music dynamics. In view of this problem, the inventive circuit, an embodiment of which is depicted in FIG. 2, maintains the power supply on for a predetermined duration once it has been activated. In order words, it turns on the power supply as fast as possible when required. However, the circuit then takes a predetermined time to turn the power supply off. Thus, the circuit "holds the boost" in place accommodating the dynamic nature of music.

Turning now to FIG. 2, the present invention comprises a power boost control circuit for a loudspeaker system, the inventive circuit designated generally by the reference number 100. The loudspeaker system comprises a speaker with a signal output ("Speaker Out") 104 having a voltage and a switching-mode power supply with a controller 106. As these elements of the system may be conventional, they are not shown or explained in detail herein.

The circuit 100 is configured to detect a pre-clipping condition. To that end, the circuit 100 may include a pre-clipping detection circuit 110 to receive the signal output 104 from the speaker and configured to detect when the voltage of the signal exceeds a pre-clipping threshold and to output a signal when the pre-clipping threshold is exceeded. The threshold setting may vary. In one embodiment, the pre-clipping threshold is between fifty percent and ninety-nine percent of the power supply voltage. More preferably, the pre-clipping threshold is between seventy percent and ninety percent of the power supply voltage.

The design of the pre-clipping detection circuit 110 may vary. In one embodiment, the pre-clipping detection circuit 110 comprising a voltage reference and a comparator that outputs a positive voltage when the reference voltage is exceeded. In the illustrative circuit shown, the pre-clipping detection circuit 110 comprises an operational amplifier 112 with inverting and noninverting inputs.

A first voltage divider 114 is interposed between the signal output 104 from the speaker and one of the inverting and noninverting inputs of the operational amplifier 112, and a second voltage divider 116 is interposed between the power supply and the other one of the inverting and non-inverting inputs of the operational amplifier. The first voltage divider 114 is configured to divide the voltage in half, and the second voltage divider 116 is configured to output a reference voltage of less than half of the power supply voltage ("+V power supply") at 118. The operational amplifier 112, operating as a comparator, outputs a positive voltage when the voltage output by the first voltage divider 114 exceeds the reference voltage from the second voltage divider 116. As indicated, the reference voltage should be less than half the voltage of the power supply. Preferably, the reference voltage is between thirty percent and forty-nine percent of the power supply voltage, and more preferably may be between thirty-five percent and forty-five percent of the power supply voltage.

As an example, the first and second voltage dividers 114 and 116 both may be a resistive voltage divider. Both resistors in the first voltage divider are set at the same value, such as 47 KOhms for example, as this causes the signal on the tap 118 to have a value of 0.5 times the voltage of the speaker output 104. Ry must have a higher impedance than Rx in order for the second voltage divider to produce a reference voltage that is less than half of the power supply. To that end, in the example shown, Ry may be 68 KOhms, so that the tap 120 between Ry and Rx in the second voltage divider 116 will have 0.41 times the power supply voltage.

Thus, in this example, with the values mentioned above, when Speaker Out 104 exceeds eighty-two percent (82%) of the total power supply voltage 118, the op-amp 112 will output a positive voltage at 124. In other words, when the Speaker Out 104 swings enough to approach the power supply voltage rails with a margin of less than eighteen percent (18%), as depicted in FIG. 1B, the op-amp 112 will output a positive voltage.

Thus, in this example, the pre-clipping threshold value is eighty-two percent (82%) of the total power supply voltage 118. The above described example is not intended to be limiting. The pre-clipping threshold may be between fifty-one percent and ninety-nine percent of the power supply voltage and, more preferably, may be between seventy percent and ninety percent of the power supply voltage.

With continuing reference to FIG. 2, the power boost control circuit 100 may further comprise a "holding" circuit 128 connected to receive the signal from the comparator 112 of the pre-clipping detection circuit 110 and to output a sustained signal to the controller 106 of the switching-mode power supply, the signal being sustained for a predetermined duration. The holding circuit 128 may analog or digital and may vary. In the illustrated circuit, the holding circuit 128 comprises a diode detector.

For example, the circuit 128 may include a diode 130 connected to receive the signal output from the pre-clipping detection circuit 110. The holding circuit 128 also may comprise a first resistor 132 connected to receive the signal output from the diode 130, and a capacitor 134 and second resistor 136 connected in parallel between the output of the first resistor and ground. The first resistor ("R attack") 132 is configured to control the charging time ("R attack") of the capacitor ("C tank") 134, and the second resistor ("R decay") 136 is configured to control the discharging time of the capacitor so that the signal output from the pre-clipping detection circuit is sustained for the predetermined duration.

In order to operate adequately with the dynamic music signals, as mentioned before, the values of "R attack," "C tank," and "R decay" must be set in a way that "C tank" gets charged very rapidly and discharged very slowly when the op-amp 112 (or other comparator) outputs a positive voltage. For example, illustrative values may be 10 KOhms for "R attack" 132, 1 µF for "C tank" 134, and 4 MOhms for "R decay" 136.

Whenever the op-amp 112 in comparator mode outputs the positive output voltage because the speaker output 104 swing is approaching the power supply rails, "C tank" will rapidly charge through "R attack." Depending on the characteristics of the holding circuit 128 and the controller 106, it may be beneficial to include a buffering circuit 140 to improve the impedance characteristics of the node of "C tank," "R attack," and "R decay." The buffering circuit 140 may be any suitable voltage buffer. In the exemplary circuit shown, the buffering circuit 140 may simply comprise a voltage buffer amplifier 142. Basically, this node has a relatively high impedance and may be inadequate to be fed into a power supply controller. By buffering it, "driving strength" is gained as the output impedance of the buffer op-amp 142 is low and the current capability is higher.

Once this signal is buffered, it is then fed into the power supply controller 106. The controller 106 in turn will increase the PWM duty cycle. This increases the "+V power supply" rail at 118. Hence, when the pre-clipping condition is detected ("Speaker Out" 104 swinging beyond 82% of "+V power supply" 118 in the above example), the power supply is directed to increase output voltage "+V power supply," thereby increasing the headroom h" for more output swing, as illustrated in FIG. 1C. Once the power supply increases the output voltage, even in the absence of a music signal, it will continue to drive "+V power supply" to a higher level for as long as "C tank" 134 in the holding circuit 128 is holding a charge, which is slowly bleeding through "R decay" 136.

This circuit's response to dynamic changes in music is illustrated by the following example. A musical instrument, such as a drum, hits hard and causes the power supply voltage to increase. Then, a "mellow" or quieter part of the song follows, in which the music is not as demanding of power. However, the power supply voltage remains increased because "R decay" takes a long time to discharge "C tank." When the drum hits hard again, the power supply voltage is still at the higher level, allowing for perfect music signal reproduction, that is, there is more than enough headroom for Speaker Out to swing as much as necessary.

When the song ends or the listener turns the volume down to a much lower level, not as much "+V power supply" is needed anymore. This causes "R decay" to have enough time to discharge "C tank" completely, which will cause the power supply to lower "+V power supply" to a smaller level and/or shut down completely. The next time the listener increases the volume and/or the music hits hard again, the process will repeat and the power supply will be activated accordingly "on demand" and sustained for the predetermined delay period. In other words, at low to medium listening levels, the power supply may remain completely off, and during high listening levels the power supply may remain at full power for as long as necessary.

The embodiments shown and described above are exemplary. Many details are often found in the art and, therefore, many such details are neither shown nor described herein. It is not claimed that all of the details, parts, elements, or steps described and shown herein are newly invented. Where one such component is shown and described, it will be noted that this can be replaced by multiple components providing the same overall functionality, and similarly where functionality is shown distributed between different blocks for ease of illustration, this functionality can be provided in a single component, all within the principles of the invention to the full extent indicated by the broad meaning of the terms in the attached claims. The description and drawings of the specific embodiments herein do not point out what an infringement of this patent would be, but rather provide non-limiting examples of how to use and make the invention. Likewise, the abstract is neither intended to define the invention, which is measured by the claims, nor is it intended to be limiting as to the scope of the invention in any way. The limits of the invention and the bounds of the patent protection are measured by and defined in the following claims.

What is claimed is:

1. A power boost control circuit for a loudspeaker system, wherein the loudspeaker system comprises a speaker with a signal output having a voltage and a switching-mode power supply having a voltage and including a controller having an input, the power boost control circuit comprising:
    a pre-clipping detection circuit connectable to receive a signal output from the speaker, wherein the pre-clipping detection circuit comprises a pre-clipping threshold voltage and is configured to detect when the voltage of the signal output from the speaker exceeds the pre-clipping threshold voltage and to output a signal when the pre-clipping threshold voltage is exceeded, the pre-clipping detection circuit further comprising a reference voltage and a comparator that outputs a positive voltage when the voltage of the signal output from the speaker exceeds the reference voltage;
    a holding circuit comprising a diode detector, the holding circuit connected to receive a signal from the comparator of the pre-clipping detection circuit and to output a sustained signal to the controller of the switching-mode power supply, the sustained signal being sustained for a predetermined duration; and
    a voltage buffer connected between the holding circuit and the controller of the switching-mode power supply.

2. The circuit of claim 1, wherein the voltage buffer comprises an operational amplifier in negative feedback mode.

3. The circuit of claim 1, wherein the pre-clipping threshold is between fifty-one percent and ninety-nine percent of the switching-mode power supply voltage.

4. The circuit of claim 3, wherein the pre-clipping threshold is between seventy percent and ninety percent of the switching-mode power supply voltage.

5. The circuit of claim 1, wherein the comparator of the pre-clipping detection circuit comprises an operational amplifier having inverting and noninverting inputs, wherein the pre-clipping detection circuit further comprises a first voltage divider interposed between the signal output from the speaker and one of the inverting and noninverting inputs of the operational amplifier and configured to divide the voltage in half with inverting and noninverting inputs, and wherein the reference voltage comprises a second voltage divider interposed between the switching-mode power supply voltage and the other one of the inverting and noninverting inputs of the operational amplifier and configured to output a reference voltage of less than half of the switching-mode power supply voltage, so that the operational amplifier outputs a positive voltage when a voltage output by the first voltage divider exceeds the reference voltage.

6. The circuit of claim 5, wherein each of the first and second voltage dividers is a resistive voltage divider.

7. The circuit of claim 5, wherein the reference voltage is between thirty percent and forty-nine percent of the switching-mode power supply voltage.

8. The circuit of claim 7, wherein the reference voltage is between thirty-five percent and forty-five percent of the switching-mode power supply voltage.

9. The circuit of claim 1, wherein the diode detector of the holding circuit comprises:
    a diode connected to receive a signal output from the pre-clipping detection circuit;
    a first resistor connected to receive a signal output from the diode; and
    a capacitor and a second resistor connected in parallel between an output of the first resistor and ground;
    wherein the first resistor is configured to control the charging time of the capacitor and the second resistor is configured to control the discharging time of the capacitor so that the signal output from the pre-clipping detection circuit is sustained for the predetermined duration.

10. A loudspeaker system comprising a signal source, a speaker, a switching-mode power supply with a controller, and the power boost control circuit of claim 1.

11. A power boost control circuit for a loudspeaker system, wherein the loudspeaker system comprises a speaker with a signal output having a voltage and a switching-mode power supply with a controller having an input, the power boost control circuit comprising:
    a pre-clipping detection circuit connectable to receive the signal output from the speaker and configured to detect when the voltage of the signal output from the speaker exceeds the pre-clipping threshold voltage and to output a signal when the pre-clipping threshold voltage is exceeded; and
    a holding circuit connected to receive the signal from the pre-clipping detection circuit, to output a signal to the controller of the switching-mode power supply in response to receiving the signal from the pre-clipping detection circuit, and to sustain the signal output from the holding circuit for a predetermined duration.

12. The circuit of claim 11, further comprising a voltage buffering circuit connected between the holding circuit and the controller of the switching-mode power supply.

13. The circuit of claim 12, wherein the voltage buffering circuit comprises an operational amplifier in negative feedback mode.

14. The circuit of claim 11, wherein the pre-clipping threshold voltage is between fifty-one percent and ninety-nine percent of the switching-mode power supply.

15. The circuit of claim 11, wherein the pre-clipping threshold voltage is between seventy percent and ninety percent of the switching-mode power supply.

16. The circuit of claim 11, wherein the pre-clipping detection circuit comprises:
    an operational amplifier with inverting and noninverting inputs;
    a first voltage divider interposed between the signal output from the speaker and one of the inverting and noninverting inputs of the operational amplifier and configured to divide the voltage in half; and a second voltage divider interposed between the switching-mode power supply and the other one of the inverting and noninverting inputs of the operational amplifier and configured to output a reference voltage of less than half of the switching-mode power supply;

whereby the operational amplifier outputs a positive voltage when the voltage output by the first voltage divider exceeds the reference voltage.

17. The circuit of claim 16, wherein each of the first and second voltage dividers is a resistive voltage divider.

18. The circuit of claim 17, wherein the reference voltage is between thirty percent and forty-nine percent of the switching-mode power supply.

19. The circuit of claim 18, wherein the reference voltage is between thirty-five percent and forty-five percent of the switching-mode power supply.

20. The circuit of claim 11, wherein the holding circuit comprises a diode detector.

21. The circuit of claim 20, wherein the diode detector comprises:
   a diode connected to receive the signal output from the pre-clipping detection circuit;
   a first resistor connected to receive a signal output from the diode; and
   a capacitor and a second resistor connected in parallel between an output of the first resistor and ground;
   wherein the first resistor is configured to control the charging time of the capacitor and the second resistor is configured to control the discharging time of the capacitor so that the signal output from the pre-clipping detection circuit is sustained for the predetermined duration.

22. A loudspeaker system comprising a signal source, a speaker, a switching-mode power supply with a controller, and the power boost control circuit of claim 11.

23. A method for supplying "on-demand" power boosts in a sound system having a speaker and a switching-mode power supply, wherein the speaker has a signal output, and the switching-mode power supply includes a controller, the method comprising:
   increasing the switching-mode power supply for a period of a predetermined duration in response to a speaker output voltage that exceeds a predetermined pre-clipping threshold voltage.

24. The method of claim 23 wherein the step of increasing the switching-mode power supply comprises comparing the voltage of the speaker signal output to a reference voltage and producing a positive voltage when the speaker signal voltage exceeds the predetermined pre-clipping threshold voltage.

25. The method of claim 24 wherein the step of increasing the switching-mode power supply comprises sustaining the positive voltage signal for the predetermined duration.

26. The method of claim 25 wherein the switching-mode power supply controller includes an adjustable duty cycle and the step of sustaining the positive voltage signal for the predetermined duration comprises using the sustained positive voltage signal to control the duty cycle in the switching-mode power supply controller.

* * * * *

UNITED STATES PATENT AND TRADEMARK OFFICE
CERTIFICATE OF CORRECTION

PATENT NO. : 11,072,298 B1  
APPLICATION NO. : 16/231824  
DATED : July 27, 2021  
INVENTOR(S) : Fernando Eid Pires Page 1 of 1

It is certified that error appears in the above-identified patent and that said Letters Patent is hereby corrected as shown below:

On the Title Page

Column 2, Under U.S. Patent Documents, Line 12: replace "3,023,688 A1" with --8,023,688 B2--.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*